United States Patent [19]
Kramer et al.

[11] Patent Number: 6,073,361
[45] Date of Patent: Jun. 13, 2000

[54] APPARATUS FOR EXTERNALLY MONITORING RPM OF SPIN RINSE DRYER

[75] Inventors: Doris Kramer, Gilroy; Christie Corpus, Milpitas; Frederick Acosta, Modesto, all of Calif.

[73] Assignee: LSI Logic Corporation, Milpitas, Calif.

[21] Appl. No.: 09/081,337

[22] Filed: May 19, 1998

[51] Int. Cl.$^7$ .................................................. F26B 17/24
[52] U.S. Cl. ............................................................ 34/58
[58] Field of Search .................................. 34/58, 60, 63, 34/90, 91, 312, 313, 317; 428/34.5, 34.7, 36.4; 355/54, 78, 86, 95, 132; 134/111, 153, 902; 414/217, 938, 939

[56] References Cited

U.S. PATENT DOCUMENTS

| | | | |
|---|---|---|---|
| 4,120,583 | 10/1978 | Hyatt | 355/86 |
| 4,445,776 | 5/1984 | Hyatt | 355/78 |
| 5,339,539 | 8/1994 | Shiraishi et al. | 34/58 |
| 5,563,798 | 10/1996 | Berken et al. | 364/478.06 |
| 5,577,331 | 11/1996 | Suzuki | 34/58 |
| 5,692,313 | 12/1997 | Ikeda et al. | 34/58 |
| 5,784,797 | 7/1998 | Curtis et al. | 34/58 |
| 5,784,802 | 7/1998 | Thompson et al. | 34/58 |

*Primary Examiner*—Stephen Gravini

[57] ABSTRACT

A system for externally monitoring the angular rotation rate of a spin rinse dryer chamber in a semiconductor fabrication facility. The system includes a spin rinse dryer comprised of a dryer housing and a chamber wall that is capable of rotating within the housing. The chamber wall defines a chamber suitable for receiving a designated wafer carrier. The dryer further includes a chamber door hinged to the housing for enclosing the chamber. The spin rinse dryer is configured to rotate the chamber when activated. A detection apparatus of the system is positioned externally to the dryer housing in proximity to the chamber. The detection apparatus is adapted to detect the angular rotation rate of a detectable marker affixed to an exterior wall of the designated wafer carrier when the designated wafer carrier is placed in the chamber and the spin rinse dryer is activated.

13 Claims, 3 Drawing Sheets

APPARATUS FOR EXTERNALLY MONITORING RPM OF SPIN RINSE DRYER

BACKGROUND OF THE INVENTION

1. Field of the Invention

The invention relates to the field of semiconductor fabrication processes and more particularly to a method and apparatus for monitoring the angular rotation rate of a spin rinse dryer by placing an identifying mark on a designated wafer carrier and monitoring the identifying mark with an external monitoring apparatus such as a tachometer.

2. Description of the Relevant Art

Semiconductor integrated circuits have been widely employed in virtually every type of electronic device since the early 70's. In the typical semiconductor fabrication process used to fabricate these integrated circuits, a single crystal semiconductor wafer, typically comprised of silicon, is fabricated into integrated circuits by forming a large number of individual circuit elements such as resistors, capacitors, and transistors, and, thereafter, selectively interconnecting the individual circuit elements with one or, more typically, multiple levels of interconnect layers. Even the most routine fabrication process requires a great many process steps that must be carried out with exacting precision in the cleanest of environments if the final product is to be functional. The various parameters associated with each step of the fabrication process must be closely monitored by the fabrication facility personnel to prevent undesirable deviations from specified optimum levels of the parameters.

To provide the accurate monitoring of various deposition, etch, and photolithography steps, semiconductor equipment manufacturers typically incorporate highly sophisticated monitoring equipment on each machine that is installed in a customer's fabrication facility. The monitoring equipment provides the feedback necessary for the manufacturer to insure an adequate yield from the process (where yield refers to the percentage of devices on a wafer that are functional). While many process steps require semiconductor fabrication equipment, such as deposition machines, photo aligners, and implant machines, costing hundreds of thousands of dollars, perhaps an equal number of process steps, or process substeps, involve equipment of far less complexity and cost. An example of a piece of equipment that fits this description is the well known spin rinse dryer found in multiple locations within virtually every fabrication facility.

Conventional spin rinse dryers are used extensively in conjunction with wet processing steps to rinse the wafers with ultra pure deionized water and to subsequently spin dry the wafers. Despite their relative simplicity in comparison to implanters, CVD reactors, photo aligners, plasma etchers, and various other pieces of process equipment, spin rinse dryers are an important component of any fabrication process and maintaining the highest feasible control over the parameters associated with spin rinse dryers is critical. The three most significant process parameters in any spin rinse dry operation are the duration of the process, the resistivity, and the angular rotation rate of the dryer chamber (most commonly reported in terms of revolutions-per-minute or "RPM").

To insure the highest quality, these parameters should be regularly calibrated to detect and minimize any drift in the reported vs. actual value of the parameters. Therefore, it would be highly desirable to implement an economical and practical method for monitoring, adjusting, and calibrating the duration, resistivity, and angular rotation rate of each spin rinse dryer in a fabrication facility. While techniques and processes for monitoring the resistivity and duration are widely available, the monitoring of the angular rotation parameter has been largely ignored resulting in less control over the spin rinse dry process.

SUMMARY OF THE INVENTION

The problem identified above is in large part addressed by a system and method for externally monitoring and calibrating the angular rotation rate of a spin rinse dryer in a semiconductor fabrication facility. A detectable marker is affixed to a designated wafer carrier. The detectable marker facilitates external monitoring of the angular rotation rate using a detection device such as a commercially available calibrated tachometer.

Accordingly, it is an object of this invention to provide an economical and reliable system for monitoring and calibrating the angular rotation rate of a spin rinse dryer. It is an additional object of the invention to provide a corresponding method of monitoring and calibrating the angular rotation rate of the dryer. It is still a further object of the invention to provide a designated wafer carrier suitable for use in the described method and system.

Broadly speaking, the present invention contemplates a system for externally monitoring the angular rotation rate of a spin rinse dryer chamber in a semiconductor fabrication facility. The system includes a spin rinse dryer. The dryer includes a dryer housing and a chamber wall that is capable of rotating within the housing. The chamber wall defines a chamber that is suitable for receiving a designated wafer carrier. The dryer further includes a chamber door hinged to the housing for enclosing the chamber. The spin rinse dryer is configured to rotate the chamber at a selected angular rotation rate when activated. A detection apparatus of the system is positioned externally to the dryer housing in proximity to the chamber. The detection apparatus is adapted to detect the angular rotation rate of a detectable marker affixed to an exterior wall of the designated wafer carrier when the designated wafer carrier is placed in the chamber and the spin rinse dryer is activated.

In one embodiment, the system further includes a designated wafer carrier comprised of a carrier frame and a detectable marker affixed to an exterior surface of the frame. The carrier frame is comprised of a first material while the detectable marker is comprised of a second material. In one embodiment, the carrier is suitable for receiving a plurality of semiconductor wafers and suspending the plurality of wafers in substantially parallel planes such that the carrier prevents contact between adjacent wafers. Preferably, the reflectivity of the second material, which is preferably comprised of aluminum, is greater than a reflectivity of the first material, which is preferably comprised of plastic or "Teflon."™ The chamber door includes a transparent window in the preferred embodiment. In this embodiment, the detection apparatus is placed in proximity to the transparent window, and the detectable marker is viewable through the transparent window. In the presently preferred embodiment, the detection apparatus comprises a calibrated tachometer and, still more preferably, is traceable to a NIST standard such that the angular rotation rate detected by the detection apparatus is essentially equivalent to the actual rotation rate and is, therefore, suitable for calibrating the selected angular rotation rate.

The present invention still further contemplates a designated wafer carrier suitable for monitoring the angular rotation rate of a spin rinse dryer chamber. The designated wafer carrier includes a carrier frame comprised of a first material such as plastic or "Teflon"™ and a detectable marker comprised of a second material such as aluminum. The reflectivity of the second material is preferably greater than the reflectivity of the first material. The marker is affixed to an external surface of the frame, preferably on a forward cross member of the carrier so that the marker is visible through a transparent window in the chamber door. Rotation of the marker is suitably detected by a detection apparatus when the designated wafer carrier is placed in the chamber and the dryer is activated. In one embodiment, the wafer carrier is of a type used in production and is configured to receive a plurality of semiconductor wafers and to suspend the plurality of wafers in substantially parallel planes displaced by a separation displacement to prevent adjacent wafers from coming into contact.

The present invention still further contemplates a method of monitoring an angular rotation rate of a designated wafer carrier in a spin rinse dryer chamber. First, the designated wafer carrier is inserted into the spin rinse dryer chamber. The carrier, as above, includes a detectable marker affixed to an exterior surface of the carrier frame. The spin rinse dryer is then activated to achieve an angular rotation of the spin rinse dryer chamber and, accordingly, the carrier. Then, a detection device positioned in proximity to the spin rinse dryer chamber is utilized to obtain a detected angular rotation rate of a detectable marker affixed to the designated wafer carrier. In one embodiment, a desired angular rotation rate is selected prior to activating the spin rinse dryer. In one embodiment, the detection device comprises a calibrated tachometer so that the detected rotation rate reflects an actual rotation rate of the dryer chamber. Preferably, the detection device is traceable to a NIST standard so that the external detection of the rotation rate may be used to calibrate the dryer by adjusting the dryer to minimize differences observed between the externally detected rotation rate and the selected or desired rotation rate.

BRIEF DESCRIPTION OF THE DRAWINGS

Other objects and advantages of the invention will become apparent upon reading the following detailed description and upon reference to the accompanying drawings in which.

Figure 1:
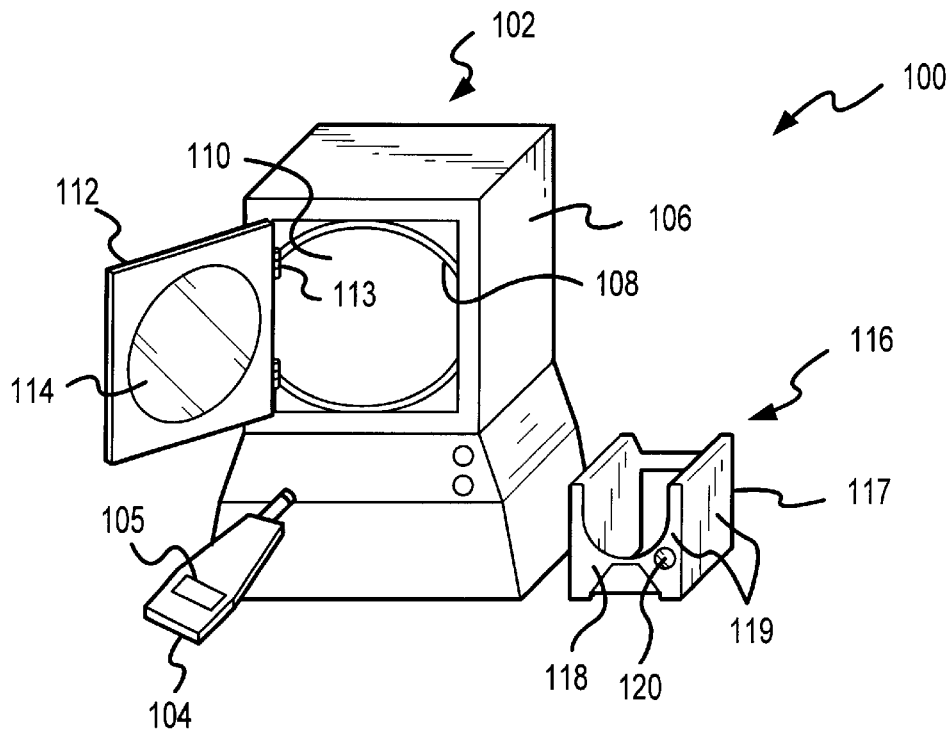
FIG. 1 is a diagram of a system for externally detecting the angular rotation rate of a spin rinse dryer according to the present invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Figure 3:
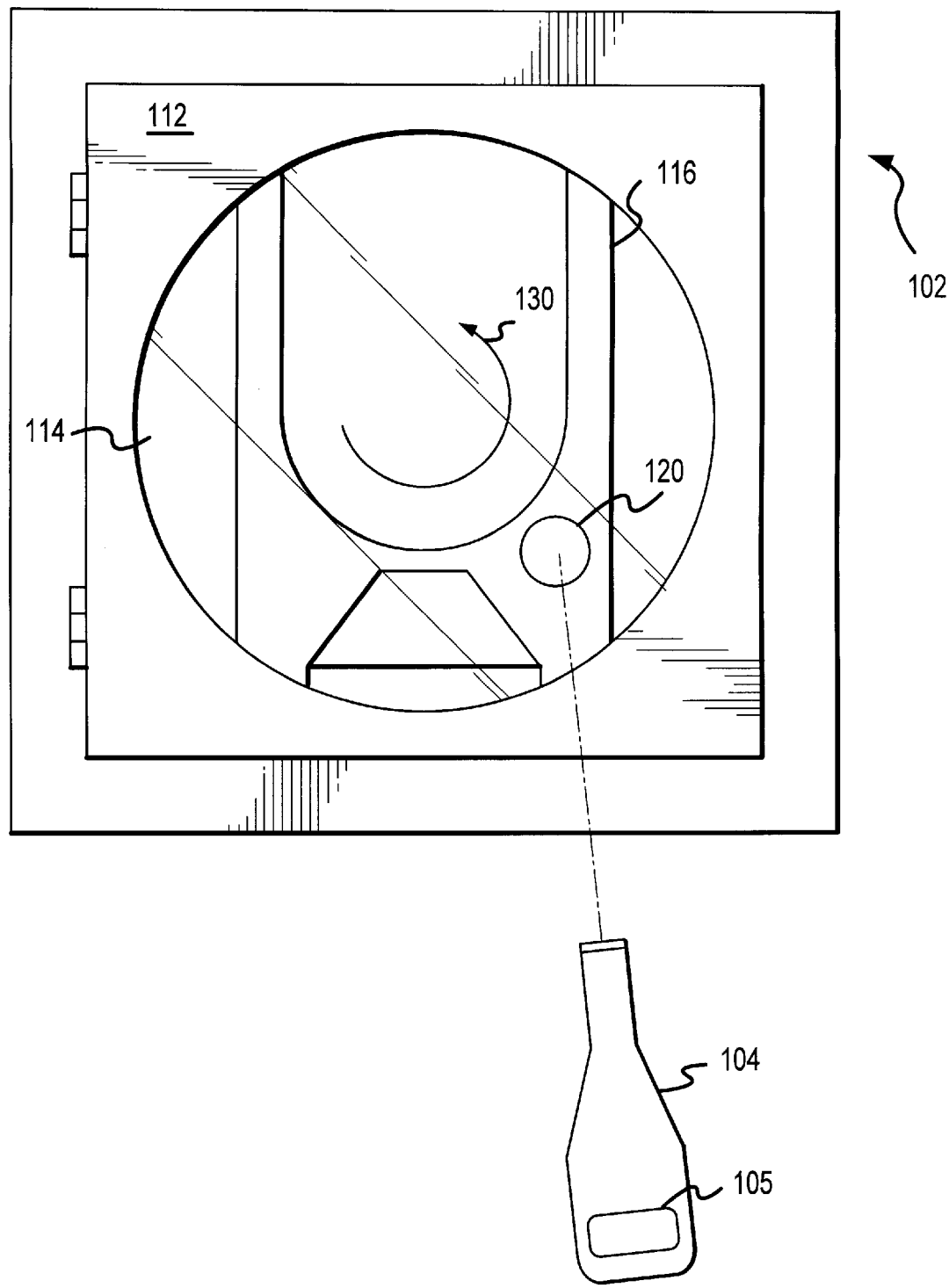
FIG. 3 is a depiction of the wafer carrier of FIG. 2 rotating within a chamber of a spin rinse dryer.

Turning now to the drawings, FIG. 1 is a diagram of a system 100 for monitoring and, in the preferred embodiment, calibrating the angular rotation rate of an apparatus such as spin rinse dryer 102. The basic components of system 100 include dryer 102 and detection device 104. Spin rinse dryer 102 includes a dryer housing 106 and a chamber wall 108 that defines a dryer chamber 110. Chamber wall 108 is pivotally or rotatably affixed to housing 106 and spin rinse dryer 102 is adapted to rotate objects placed in chamber 110. Preferably, chamber 110 is suitably adapted to receive wafer carrier 120. Spin rinse dryer 102 still further preferably includes a chamber door 112 hinged to housing 106 by hinge means 113 for enclosing chamber 110. Chamber door 112 typically includes a transparent window 114 preferably comprised of quartz or glass. Commercially available examples of spin rinse dryers includes a series of dryers available from Verteq Corporation and other vendors. Such dryers are familiar to those in the field of semiconductor fabrication and are typically installed in a wet configuration in which ultra pure DI water is available for rinsing wafers within chamber 110. Although the specific embodiment of spin rinse dryer 102 depicted in FIGS. 1 and 3 show a single chamber, front loading spin rinse dryer, it will be readily appreciated that alternative embodiments, including multiple chamber and top loading dryers may also be incorporated into system 100.

System 100 further includes detection apparatus 104. Detection apparatus 104 is positioned externally to housing 106 of dryer 102 in proximity to housing 110. Detection device 104 is suitably configured to detect angular motion and, in the context of the present invention, is more specifically adapted to detect angular motion of a detectable marker 120 affixed to an exterior surface 119 of wafer carrier 116 when carrier 116 is placed in chamber 110 and dryer 102 is activated (i.e., rotating). In an embodiment in which detection marker 120 is affixed to a forward crossbow 118 of designated carrier 116, detection apparatus 104 detects the angular rotation rate of marker 120 by "viewing" marker 120 through transparent window 114 of chamber door 112 when chamber door 112 is closed. Detection apparatus typically 104 suitably includes output means 105, such as an LCD panel, for reporting the angular rotation rate (typically in units of revolutions per minute or "RPM"). In the preferred embodiment, detection apparatus 104 comprises a non-contact or "touchless" tachometer suitable for detecting angular motion of a reflective object. A commercially available example of a tachometer of this type is Catalog No. 4060 from Control Company (www.control3.com). In an embodiment suitable for using detection apparatus 104 not simply as a means of detecting the angular rotation of spin rinse dryer 102, but for calibrating the rotation rate for quality control purposes, detection apparatus 104 is preferably calibrated and traceable to a NIST standard. In embodiments of this type, the present invention contemplates a system for calibrating the angular rotation rate of spin rinse dryer 102 by comparing the detected rotation rate with a traceable calibrated detection apparatus to the expected rotation rate and adjusting dryer 102 in response to differences between the two rotation rates. The expected rotation rate refers to the rotation rate that dryer 102 attempts to produce. In typical embodiments, dryer 102 includes input means for selecting a desired rotation rate. In these embodiments, the expected rotation rate is the rotation rate selected by the operator, technician, or engineer.

The system 100 of the present invention may further include designated wafer carrier 116. Wafer carrier 116 includes a carrier frame 117 comprised of a first material and dimensioned such that carrier 116 is suitable for being received within chamber 110 of spin rinse dryer 102. In one embodiment, a conventional, production worth wafer cassette is used as carrier frame 117. In this embodiment, the carrier frame 117 is suitably comprised of a material such as plastic or "Teflon"™ that is rigid and resistant to a broad spectrum of acids and other chemical solutions. Designated wafer carrier 116 further includes a detectable marker 120 comprised of a second material and affixed to an exterior surface 119 of carrier frame 117. In an embodiment in which the angular rotation rate of spin rinse dryer 102 is detected by reflecting light off of detectable marker 120, the reflectivity of the second material of detectable marker 120 is greater than the reflectivity of the first material of carrier frame 118. In one embodiment, detectable marker 120 is comprised of a highly reflective material such as aluminum.

Figure 2:
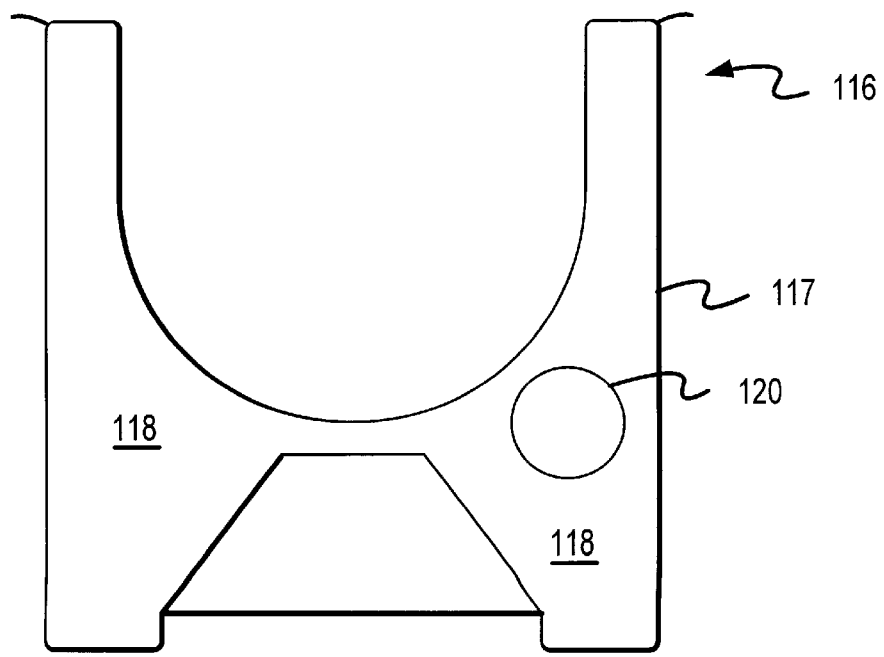
FIG. 2 is a front view of the a wafer carrier contemplated by the present invention.

Turning to FIG. 2, a front view of designated wafer carrier 120 is presented. The embodiment of designated wafer carrier 116 shown FIG. 2, in which detectable marker 120 is positioned on a forward crossbow 118 of designated wafer carrier 116, facilitates the detection of the angular rotation rate produced by spin rinse dryer 102 because detectable marker 120 is visible through a transparent window 114 suitably found in preferred embodiments of chamber door 112 of spin rinse dryer 102. This is seen more clearly in FIG. 3, in which detection apparatus 104 is depicted as it detects the rotation (represented in FIG. 3 by reference numeral 130) of detectable marker 120 through transparent window 114 of spin rinse dryer 102 when designated wafer carrier 116 is placed in chamber 110 and spin rinse dryer 102 is activated. As mentioned previously, one embodiment of designated wafer carrier 116 contemplates the use of a production wafer carrier for carrier frame 117. In this embodiment, it will be appreciated that designated wafer carrier 116 is configured for receiving a plurality of semiconductor wafers and for suspending these wafers in substantially parallel planes separated by a displacement sufficient to prevent contact between adjacent wafers. Various embodiments of designated wafer carrier 116 contemplate compatibility with wafers having diameters of 150, 200, and 300 mm.

Figure 4:
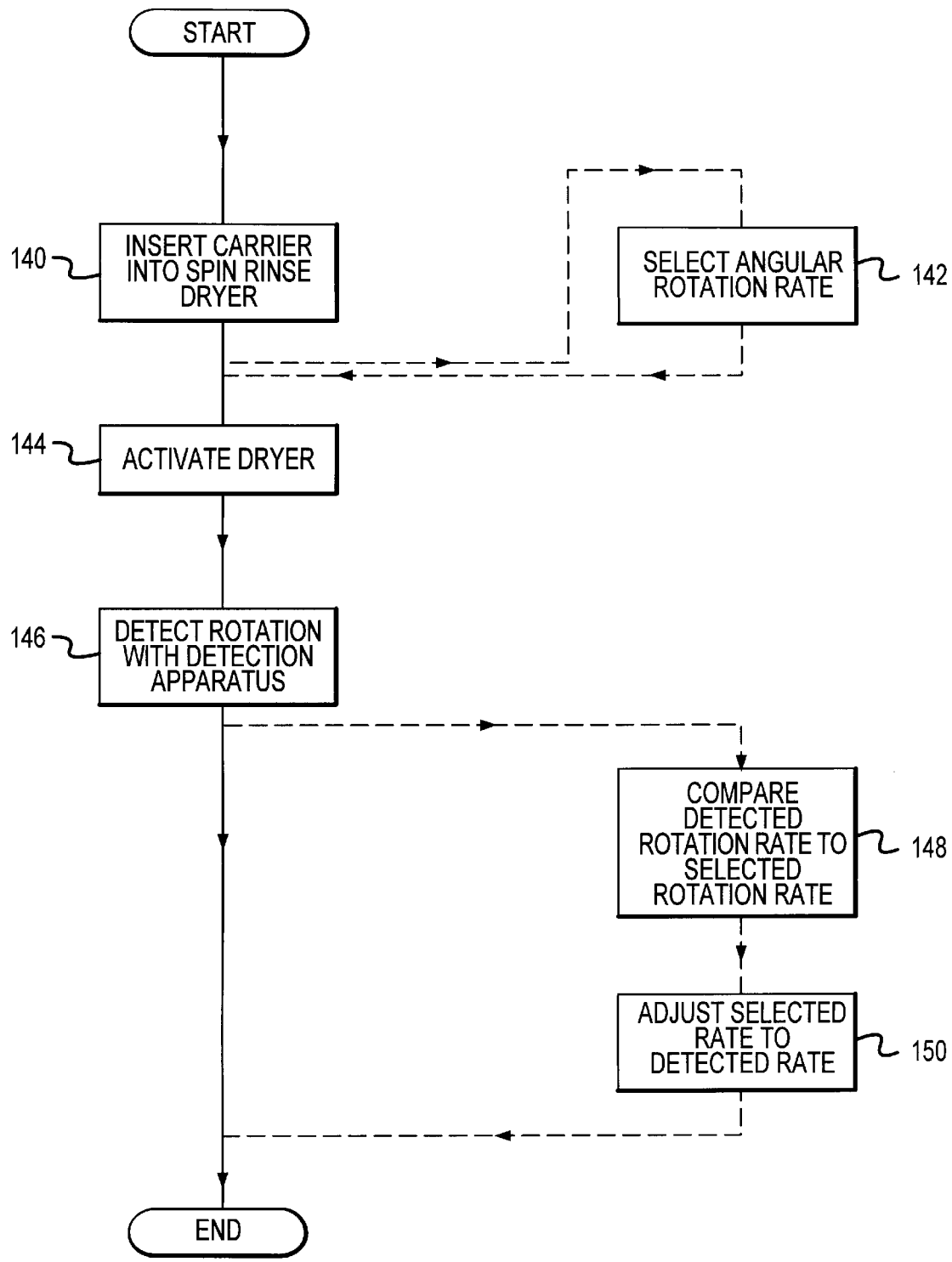
FIG. 4 is a flow diagram of a method for utilizing the system and wafer carrier of FIGS. 1–3.

Turning now to FIG. 4, a flow diagram representing a method of monitoring the angular rotation rate of spin rinse dryer 102 as contemplated herein is presented. Initially, in the method step indicated by reference numeral 140, a wafer carrier such as designated wafer carrier 116 is placed within a chamber 110 of a spin rinse dryer 102. In embodiments of the invention in which spin rinse dryer 102 includes means for selected a desired rotation rate, the desired rotation rate is selected in process 142. Although the flow diagram depicts the selection of the desired rotation rate as occurring after the insertion of designated wafer carrier 116 in spin rinse dryer 102, it will be appreciated that the reverse order is essentially equivalent. After insertion of carrier 116 into spin rinse dryer 102 and the optional selection of a desired angular rotation rate, spin rinse dryer 102 is activated in the process step indicated by reference numeral 144. The activation of spin rinse dryer 102 causes rotation of chamber 110 and, consequently, rotation of designated wafer carrier 116 and detectable marker 120. This rotation of detectable marker 120 is then detected using detection apparatus 104 in method step 146 by placing detection apparatus 104 in proximity to spin rinse dryer 102. In embodiments of the invention in which, in addition to mere detection, calibration of the rotation rate produced by spin rinse dryer 102 is desirable, the method further includes method step 148 in which the rotation rate detected by detection apparatus 104 is compared to the selected rotation rate to quantify the discrepancies between the two rates. As discussed previously, the selected rotation rate refers to either the rate input by the operator in embodiments in which spin rinse dryer 102 includes means for selecting a desired rotation rate, or the rotation rate that is specified by the spin rinse dryer manufacturer or seller in embodiments in which only a single rotation rate is available. In those embodiments in which detection apparatus 104 is itself calibrated and traceable to a NIST standard, the detected output rate presumably reflects the actual rotation rate. Calibration of spin rinse dryer 102 may, therefore, be accomplished by performing an iterative process in which spin rinse dryer 102 is adjusted in response to a measured discrepancy between the selected rotation rate and the detected rate and repeating the process until the discrepancy is substantially eliminated.

In summary, it will be apparent to those skilled in the art having the benefit of this disclosure that the present invention contemplates an economical yet elegant solution for providing a verifiably method monitoring and calibrating the angular rotation rate produced by a spin rinse dryer in a fabrication facility. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A system for externally monitoring the angular rotation rate of a spin rinse dryer chamber in a semiconductor fabrication facility, said system comprising:

a spin rinse dryer comprising a dryer housing, a chamber wall rotatably attached to said housing wherein said chamber wall defines a chamber adapted to receive a designated wafer carrier, and a chamber door hinged to said housing for enclosing said chamber, wherein said spin rinse dryer is adapted to rotate said chamber when activated; and a detection apparatus positioned externally to said dryer housing and in proximity to said chamber, wherein said detection apparatus is configured to generate a detected angular rotation rate of a detectable marker affixed to an exterior wall of said designated wafer carrier when said designated wafer carrier is placed in said chamber and said spin rinse dryer is activated.

2. The system of claim 1, further comprising said designated wafer carrier, wherein said carrier is configured for receiving a plurality of semiconductor wafers and suspending said plurality of wafers in substantially parallel planes, wherein adjacent planes are displaced by a separation distance such that said carrier prevents contact between adjacent wafers.

3. The system of claim 1, wherein said exterior wall of said designated wafer carrier comprises a first material and said detectable marker comprises a second material and wherein a reflectivity of said second material is greater than a reflectivity of said first material.

4. The system of claim 3, wherein said second material comprises aluminum.

5. The system of claim 1, wherein said chamber door includes a transparent window, said detection apparatus is placed in proximity to said transparent window, and said detectable marker is viewable through said transparent window.

6. The system of claim 1, wherein said detection apparatus comprises a calibrated tachometer.

7. The system of claim 1, wherein said detection apparatus is traceable to a standard such that said detected angular rotation rate is suitable for calibrating said selected angular rotation rate.

8. A designated wafer carrier suitable for monitoring the angular rotation rate of a spin rinse dryer chamber, wherein said designated wafer carrier comprises a carrier frame comprised of a first material, and wherein said designated carrier further includes a detectable marker comprised of a second material and affixed to an external surface of said frame, wherein a rotation of said detectable marker is suitable for detection by a detection apparatus when said designated wafer carrier is placed in said chamber.

9. The carrier of claim 8, wherein said carrier frame is configured to receive a plurality of semiconductor wafers and further configured to suspend said plurality of wafers in substantially parallel planes, wherein adjacent planes are displaced by a separation whereby said carrier frame prevents adjacent wafers from contacting each other.

10. The carrier of claim 8, wherein said first material comprises plastic.

11. The carrier of claim 8, wherein a reflectivity of said second material is greater than a reflectivity of said first material.

12. The carrier of claim 8, wherein said second material comprises aluminum.

13. The carrier of claim 8, wherein said detectable marker is affixed to a forward cross member of said carrier such that said detectable marker is visible through a transparent window of a spin rinse dryer door when said carrier is placed in said spin rinse dryer chamber.

* * * * *